(12) United States Patent
Kohashi

(10) Patent No.: US 6,677,184 B2
(45) Date of Patent: Jan. 13, 2004

(54) SEMICONDUCTOR LASER APPARATUS AND METHOD OF PRODUCING THE SAME

(75) Inventor: Ikuo Kohashi, Gojo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/294,554

(22) Filed: Nov. 15, 2002

(65) Prior Publication Data

US 2003/0063640 A1 Apr. 3, 2003

Related U.S. Application Data

(62) Division of application No. 09/777,922, filed on Feb. 7, 2001.

(30) Foreign Application Priority Data

Feb. 7, 2000 (JP) ........................................ 2000-028554

(51) Int. Cl.$^7$ .............................................. H01L 21/44
(52) U.S. Cl. ..................... 438/118; 438/26; 438/119; 438/121; 438/125
(58) Field of Search .......................... 438/26, 28, 107, 438/108, 118, 119, 121, 125

(56) References Cited

U.S. PATENT DOCUMENTS

| | | | |
|---|---|---|---|
| 5,627,851 A | | 5/1997 | Takahashi |
| 5,875,205 A | | 2/1999 | Spaeth et al. |
| 5,994,165 A | * | 11/1999 | Yoshino et al. ............. 438/118 |
| 6,210,811 B1 | | 4/2001 | Honda et al. |
| 6,326,646 B1 | * | 12/2001 | Baillargeon et al. .......... 438/29 |
| 6,518,095 B1 | * | 2/2003 | Akutsu ..................... 438/118 |

FOREIGN PATENT DOCUMENTS

| | | |
|---|---|---|
| JP | 2-86184 | 3/1990 |
| JP | 5-327028 | 12/1993 |
| JP | 6-37403 | 2/1994 |
| JP | 7-273134 | 10/1995 |

OTHER PUBLICATIONS

U.S. patent application Ser. No. 09/777,922 filed Feb. 7, 2001.

* cited by examiner

*Primary Examiner*—Kevin M. Picardat
(74) *Attorney, Agent, or Firm*—Nixon & Vanderhye P.C.

(57) ABSTRACT

In a method of producing a semiconductor laser apparatus, a conductive die-bonding paste is applied to a bonding surface in a predetermined position thereof and then pre-heated at a temperature equal to or higher than a temperature at which a diluent of the conductive die-bonding paste starts to transpire, but lower than a temperature at which the conductive die-bonding paste starts a thermosetting reaction. Then, with a semiconductor laser chip placed on the pre-heated conductive die-bonding paste, the latter is heated to be hardened. In the thus produced semiconductor laser apparatus, a highest position at which the conductive die-bonding paste adheres to end surfaces of the semiconductor laser chip is at a height of more than 0.01 mm from the bonding surface, but is below light-emitting points of the semiconductor laser chip.

9 Claims, 5 Drawing Sheets

①: POINT AT WHICH DILUENT STARTS TO TRANSPIRE (60°C)

②: POINT AT WHICH RESIN STARTS THERMO SETTING REACTION (100°C)

SEMICONDUCTOR LASER APPARATUS AND METHOD OF PRODUCING THE SAME

This application is a division of application Ser. No. 09/777,922, filed Feb. 7, 2001, the entire content of which is hereby incorporated by reference in this application.

BACKGROUND OF THE INVENTION

The present invention generally relates to semiconductor laser apparatuses and a method of producing them and more particularly, to a semiconductor laser apparatus having a semiconductor laser chip die-bonded to a bonding surface with a conductive die-bonding paste and a method of producing it.

As disclosed in Japanese Patent Application Laid-Open No. 6-37403, in conventional semiconductor laser apparatuses, a semiconductor laser chip is die-bonded to a predetermined position of a bonding surface, such as of a lead frame, a stem, or a sub-mount disposed on the stem, through a metal soldering material such as In, Pb/Sn (solder), Au/Sn or the like.

FIG. 5 shows a first conventional semiconductor laser apparatus in a state that a semiconductor laser chip 50 is bonded in a predetermined position of a die-bonding surface 51a of a sub-mount 51 with a metal soldering material 52. The metal soldering material 52 is a solid at the room temperature, and is deposited to the bonding surface in the predetermined bonding position by evaporation or the like. After the semiconductor laser chip 50 is placed on the metal soldering material 52, the metal soldering material 52 is heated to 150° C. or higher to melt. At this time, the semiconductor laser chip 50 is immobilized with a bonding collet or the like (not shown) Finally, the metal soldering material 52 is cooled to harden or set. Thus, the semiconductor laser chip 50 is die-bonded to the predetermined position of the die-bonding surface 51a. In FIG. 5, reference numeral 53 denotes a main-discharge-side light-emitting point of the semiconductor laser chip 50, reference numeral 54 denotes a monitoring sub-discharge-side light-emitting point of the semiconductor laser chip 50, and reference numeral 55 denotes an emission light axis of the semiconductor laser chip 50 connecting the main-discharge-side light-emitting point and the sub-discharge-side light-emitting point to each other.

In the method of producing the first conventional semiconductor laser apparatus shown in FIG. 5, the melting point of the metal soldering material 52 is high. Thus, the heating/cooling cycle takes much time and thus it takes long to produce the semiconductor laser apparatus. Further, the hardened metal soldering material 52 is thinner than 0.01 mm. Thus, if this semiconductor laser apparatus is adopted for an optical pick-up using a three-beam scheme which is a dominant tracking control method, the following problem occurs. Of the three beams which have returned from an optical disk, one auxiliary beam is regularly reflected off a discharge surface of the semiconductor laser chip 50 back to the optical disk, and is then incident on a signal detection photodiode to generate noise.

As a measure of overcoming the problem that it takes long to make the semiconductor laser apparatus, there is proposed a method (hereinafter referred to as second conventional art) of making a semiconductor laser apparatus. In the method, the semiconductor laser chip is die-bonded to a bonding surface with a conductive die-bonding paste (conductive adhesive agent) instead of the metal soldering material. The conductive die-bonding paste contains resin and a conductive filler such as silver flakes. It is possible to lower the hardening temperature of the conductive die-bonding paste to about 100° C., depending on the resin of the paste. Accordingly, the heating/cooling cycle becomes short. Thus it is possible to reduce the time required to produce the semiconductor laser apparatus.

FIG. 6 shows a semiconductor laser apparatus formed by die-bonding a semiconductor laser chip to a die-bonding surface with a conductive die-bonding paste. In FIG. 6, parts similar to or same as the parts shown in FIG. 5 are denoted by the same reference numerals as in FIG. 5. Reference numeral 56 denotes a conductive die-bonding paste.

In the method of producing the semiconductor laser apparatus according to the second conventional art, when the proportion of the conductive filler is increased to reduce the electric resistance of the conductive die-bonding paste 56, the viscosity of the conductive die-bonding paste 56 becomes high. Consequently, when a semiconductor laser chip 50 is placed on the conductive die-bonding paste 56, the conductive die-bonding paste 56 swells and adheres to the end surfaces and side surfaces of the semiconductor laser chip 50, and blocks a main-discharge-side light-emitting point 53 and/or a monitoring sub-light-emitting point 54. This will be concretely described below with reference to FIGS. 7A and 7B.

Referring to FIG. 7A, a predetermined slight amount of the conductive die-bonding paste 56, which has been discharged from a dispenser (not shown), is on a tip of a syringe needle 57. With a downward movement of the tip of the syringe needle 57 in a descending direction 58A, the conductive die-bonding paste 56 is placed in a predetermined position of a die-bonding surface 51a of a sub-mount 51. Then, with the tip of the syringe needle 57 moved in an ascending direction 58B as shown in FIG. 7B, the conductive die-bonding paste 56 is applied to a predetermined part of the die-bonding surface 51a of the sub-mount 51.

Then, as shown in FIG. 6, the semiconductor laser chip 50 is placed on the conductive die-bonding paste 56 applied to the die-bonding surface 51a of the sub-mount 51. The size of the lower surface of the semiconductor laser chip 50 is about 0.2 mm×0.2 mm, and the light-emitting point is located at about 0.05 mm from the lower surface of the semiconductor laser chip 50. That is, the light-emitting point is at a level higher than the semiconductor laser chip mounting surface 51a by about 0.05 mm. On the other hand, from the viewpoint of reliably applying the conductive die-bonding paste 56 to the die-bonding surface 51a, it is impossible to make the diameter of the tip of the syringe needle 57 smaller than about 0.3 mm. Consequently, the application area of the conductive die-bonding paste 56 is wider than the size (area of the lower surface) of the semiconductor laser chip 50, and the thickness of the conductive die-bonding paste 56 frequently exceeds 0.05 mm. Accordingly, as shown in FIG. 6, the conductive die-bonding paste 56 swells along the end surfaces and side surfaces of the semiconductor laser chip 50 mounted thereon. The end surfaces have the main discharge-side light-emitting point 53 and the monitoring light-emitting point 54, respectively. Thus, if the conductive die-bonding paste 56 is heated and cooled to harden in the above state, it follows that the conductive die-bonding paste 56 blocks the main-discharge-side light-emitting point 53 and the monitoring light-emitting point 54.

SUMMARY OF THE INVENTION

The present invention has been made to solve the problems. Therefore, it is an object of the present invention to provide a semiconductor laser apparatus which hardly generates noise even when it is used for a pick-up using a three-beam scheme.

It is another object of the present invention to provide a method of producing a semiconductor laser apparatus which method prevents a conductive die-bonding paste, if used, from blocking a main discharge-side light-emitting point and a monitoring light-emitting point of a semiconductor chip as mounted.

According to an aspect of the invention, there is provided a semiconductor laser apparatus having a semiconductor laser chip bonded to a bonding surface with a conductive die-bonding paste, the semiconductor laser chip having a light-emitting point at each of opposed end surfaces thereof, wherein a highest position at which the conductive die-bonding paste adheres to the end surfaces of the semiconductor laser chip is at a height of more than 0.01 mm from the bonding surface, but is below the light-emitting point of the semiconductor laser chip.

The semiconductor laser apparatus with the above arrangement does not cause noise even if it is adopted in an optical pick-up using a three-beam scheme.

In one embodiment, the conductive die-bonding paste contains an epoxy resin as a base material and silver flakes as conductive filler.

The semiconductor laser apparatus may be produced by a method according to another aspect of the invention, which comprises the steps of:

applying a conductive die-bonding paste to a die-bonding surface in a predetermined position thereof;

preheating the applied conductive die-bonding paste and then placing a semiconductor laser chip on the preheated conductive die-bonding paste; and heating the preheated conductive die-bonding paste to a temperature higher than a temperature at which the conductive die-bonding paste starts a thermosetting reaction to thereby harden the conductive die-bonding paste.

In the method of the invention, the preheating of the conductive die-bonding paste reduces the viscosity of this die-bonding paste to thereby make the thickness of the conductive die-bonding paste thinner than immediately after being applied to the die-bonding surface. Accordingly, when the semiconductor laser chip is mounted on the preheated conductive die-bonding paste, the paste is prevented from being raised up to light-emitting points of the semiconductor laser chip. Thus, the light-emitting points are not blocked by the conductive die-bonding paste.

A lower limit of the preheating temperature may be a temperature at which a diluent of the conductive die-bonding paste starts to transpire, but the preheating temperature should be lower than the temperature at which the conductive die-bonding paste starts a thermosetting reaction.

In one embodiment, the conductive die-bonding paste contains an epoxy resin as a base material and is preheated at a temperature of 60° C. or more, but lower than 100° C. (preferably, 60° C. to 80° C. inclusive).

The conductive die-bonding paste containing the epoxy resin as a base material does not change in shape even after it sets or hardens. Thus, in hardening the conductive die-bonding paste, the position and orientation of the semiconductor laser chip are prevented from being changed, namely, the initial position and orientation of the semiconductor laser chip is well maintained after the conductive die-bonding paste has been set. Thus, it is easy to produce the semiconductor laser apparatus as designed.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and therein:

FIG. 2B shows a state in which the pre-hardening has been performed;

DETAILED DESCRIPTION OF THE PREFERRED EMBODIMENTS

Figure 2A:
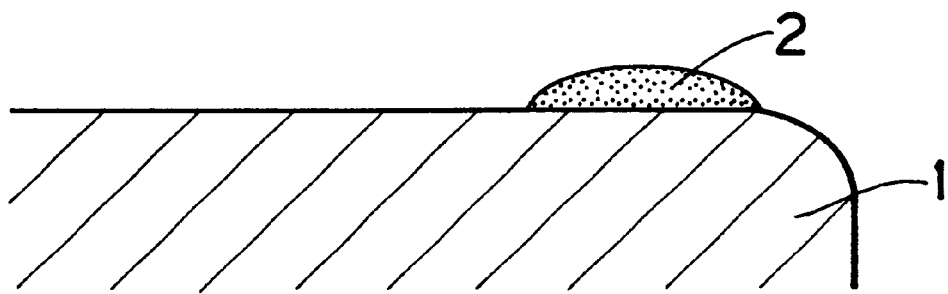
FIGS. 2A and 2B show a process step subsequent to the process step of FIG. 1B for producing the semiconductor laser apparatus of the embodiment of the present invention, FIG. 2A showing a state prior to performing a pre-hardening process.
Figure 2B:
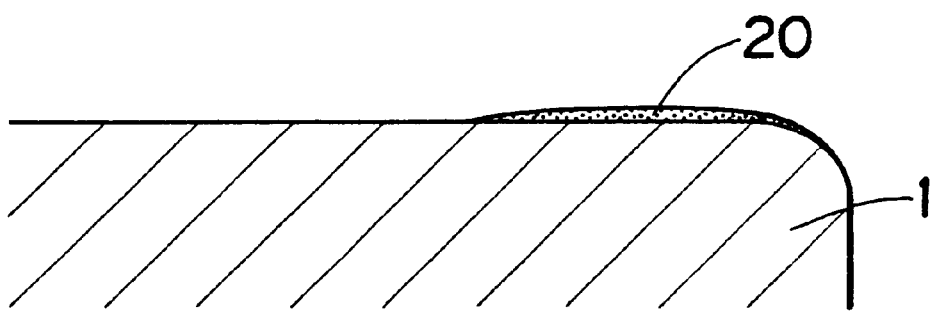
Figure 3:
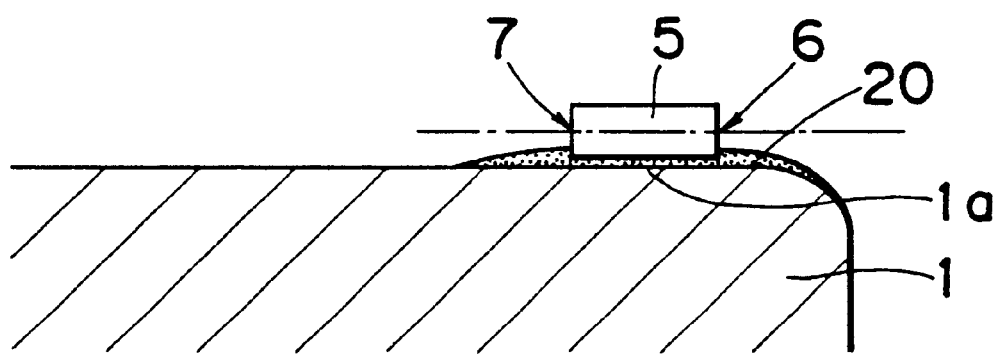
FIG. 3 shows a part of the semiconductor laser apparatus of the embodiment of the present invention in which a semiconductor laser chip has been die-bonded to a stem.

FIG. 3 shows a part of a semiconductor laser apparatus of an embodiment of the present invention in which a semiconductor laser chip 5 is die-bonded to a stem 1. The method of producing the semiconductor laser apparatus will be described below with reference to FIGS. 1A and 1B and FIGS. 2A and 2B.

Figure 1A:
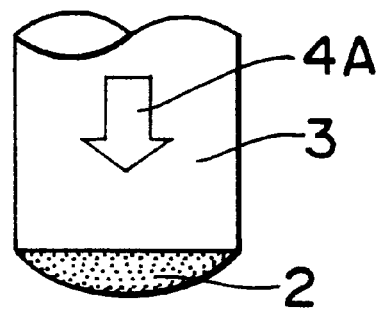
FIGS. 1A and 1B show a process step for producing a semiconductor laser apparatus of an embodiment of the present invention, FIG. 1A showing a state prior to application of die-bonding paste, and FIG. 1B showing a state after the application of the die-bonding paste.
Figure 1A:
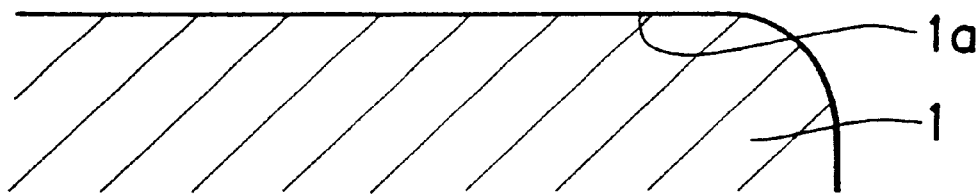
Figure 1B:
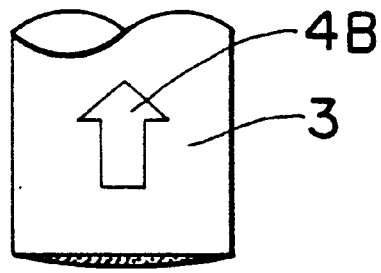
Figure 1B:
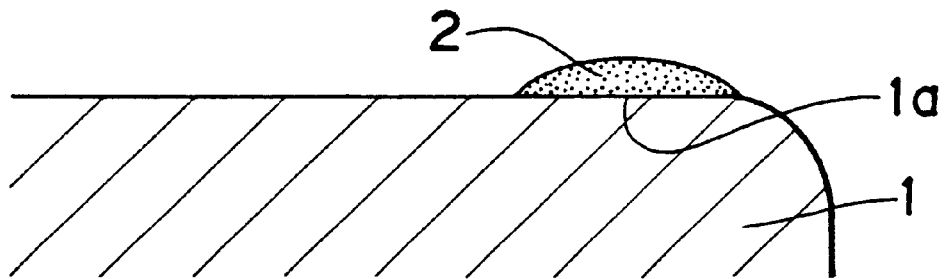

Referring first to FIGS. 1A and 1B, the stem 1 is formed by working a base metal of an iron alloy or copper alloy and then applying a surface-treatment, such as gilding, to the worked piece. Similarly to the conventional art, a conductive die-bonding paste 2 is applied to a predetermined position of a die-bonding surface 1a of the stem 1. That is, a predetermined slight amount of the conductive die-bonding paste 2, which has been ejected to a tip 3 of a syringe needle by a dispenser (not shown), is applied to the stem 1, as shown in FIG. 1B, through a downward movement indicated by arrow 4A and an upward movement indicated by arrow 4B of the syringe needle tip 3.

Figure 4:
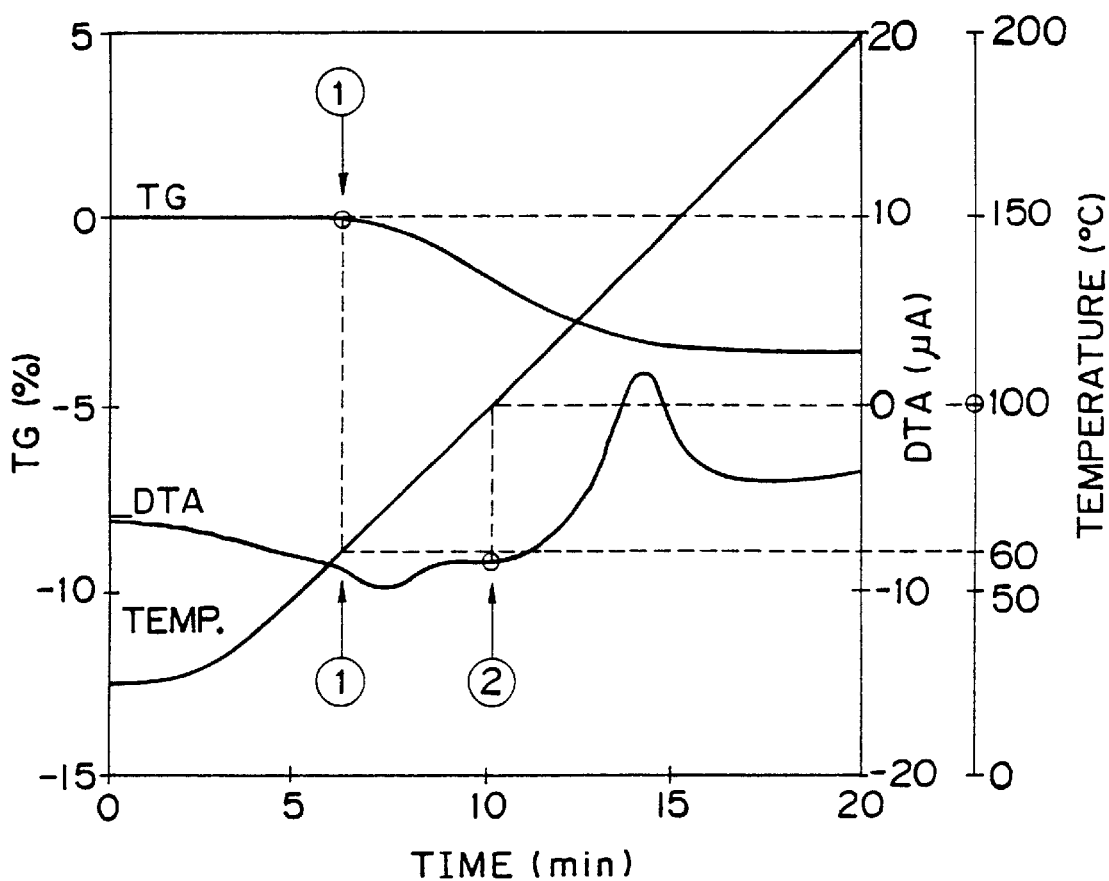
FIG. 4 shows the temperature-dependency of TG and DTA of a conductive die-bonding paste for use in producing the semiconductor laser apparatus of the embodiment of the present invention, the paste containing epoxy resin as a base material.
Figure 5:
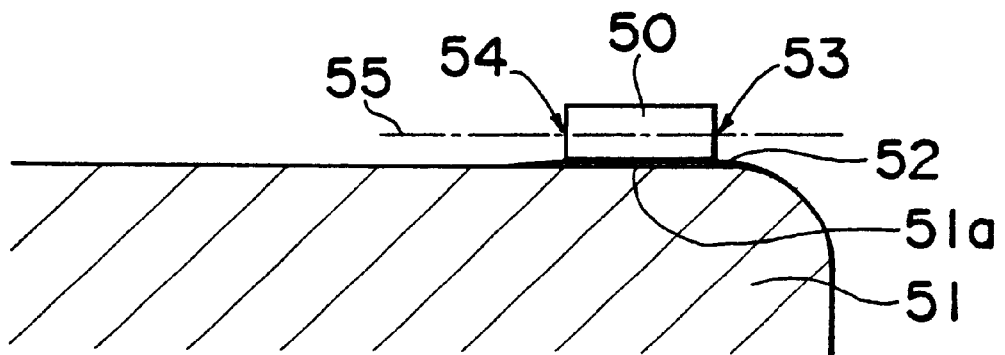
FIG. 5 shows a part of a semiconductor laser apparatus, according to a first conventional art, in which a semiconductor laser chip is die-bonded to a sub-mount.
Figure 6:
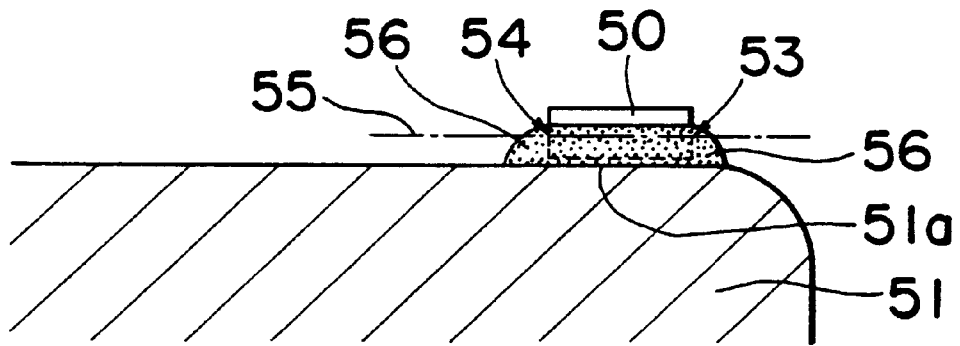
FIG. 6 shows a part of a semiconductor laser apparatus, according to a second conventional art, in which a semiconductor laser chip is die-bonded to a sub-mount.
Figure 7A:
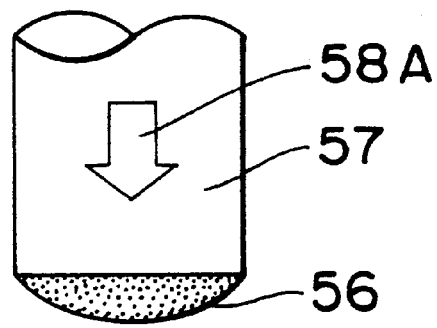
FIGS. 7A and 7B show a process step for producing the semiconductor laser apparatus of the second conventional art, FIG. 7A showing a state prior to application of die-bonding paste, and FIG. 1B showing a state after the application of the die-bonding paste.
Figure 7A:
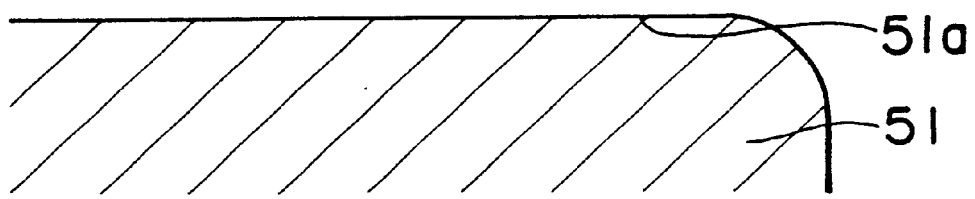
Figure 7B:
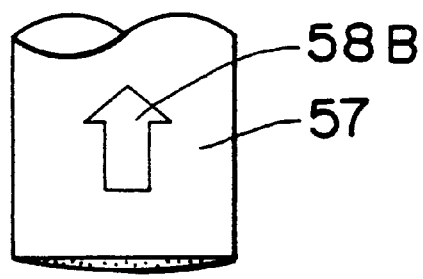
Figure 7B:
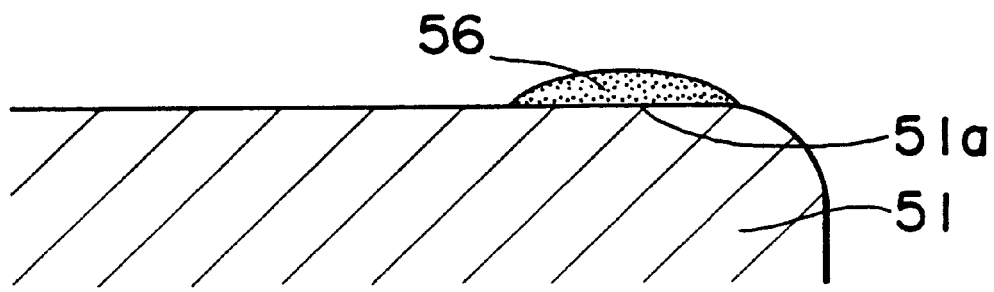

The conductive die-bonding paste 2 to be used in the semiconductor laser apparatus of the embodiment contains an epoxy resin as a base material and 80 wt % or more conductive filler of silver (Ag) flakes. FIG. 4 shows an example of the temperature-dependency of TG (Thermogravimetry) and DTA (Differential Thermal Analysis) of the conductive die-bonding paste 2. In FIG. 4, the axis of abscissas represents time, and FIG. 4 indicates that after the elapse of five minutes, temperature rises in proportion to time. The temperature corresponding to a point ① at which the TG curve starts to drop is a temperature at which a diluent starts to transpire. Also, the temperature corresponding to a point ② at which the DTA curve starts to rise is a temperature at which a thermosetting reaction of the die-bonding paste starts. FIG. 4 indicates that the temperature at which the diluent starts to transpire is about 60° C. and that the temperature at which the conductive die-bonding paste starts the thermosetting reaction starts is about 100° C.

Then the stem 1 is preheated at about 70° which is lower than the temperature at which the conductive die-bonding paste 2 applied to the stem 1 starts the thermosetting reaction. The conductive die-bonding paste 2 is high in viscosity and swells like a drop of water immediately after it has been applied to the stem 1, as shown in FIG. 2A. The preheating reduces the viscosity of the conductive die-bonding paste 2. Consequently, the conductive die-bonding paste 2 diffuses to form a preheated thin conductive die-bonding paste 20, as shown in FIG. 2B. The preheating is performed until the thickness of the preheated conductive die-bonding paste 20 becomes as thin as about 0.02 mm. The shorter the preheating time is, the higher the productivity is. However, it is preferable to preheat the stem 1 for two seconds or more in consideration of its heat capacity.

The temperature at which the conductive die-bonding paste 2 starts the thermosetting reaction is 100° C. However, if the preheating temperature is set to higher than 80° C., the transpiration speed of the diluting agent will be high. Thus, depending on a preheating time period, the conductive die-bonding paste may harden partly. On the other hand, if the preheating temperature is lower than 60° C., the viscosity of the conductive die-bonding paste is not sufficiently reduced. Accordingly, it is preferable to set the preheating temperature range to 60–80° C. The preheating at a temperature in the range of 60–80° C. reduces the viscosity of the conductive die-bonding paste favorably, without causing partial hardening of the paste.

With the semiconductor laser chip 5 mounted on the preheated conductive die-bonding paste 20, the conductive die-bonding paste 20 is heated to a temperature higher than the temperature at which the conductive die-bonding paste 2 starts the thermosetting reaction, whereby the conductive die-bonding paste 20 is fully hardened or set. In this manner, the semiconductor laser apparatus shown in FIG. 3 is obtained. In this method, the preheated conductive die-bonding paste 20 does not swell or rise above a main-discharge-side light-emitting point 6 nor a monitoring-side light-emitting point 7 of the semiconductor laser chip 5 (each light-emitting point is at a height of about 0.05 mm).

The proper hardening process takes much time. Therefore, it is preferable to heat the conductive die-bonding paste 2 for a short time on a die-bonding device to harden the paste to such an extent that the paste does not move when the semiconductor laser chip 5 is subjected to a slight shock, and then transfer the conductive die-bonding paste 2 to a different place to harden it completely.

The height of the preheated conductive die-bonding paste 20 from the mounting surface la for the semiconductor laser chip 5 is more than 0.01 mm. In an optical pick-up using the three-beam scheme, three beams (not shown) returning from an optical disk (not shown) enter an end surface of the semiconductor laser chip 5, with the three beams spaced from each other in a direction approximately perpendicularly to the die-bonding surface la at intervals of about 50 μm. Thus, in the use of the semiconductor laser apparatus of the embodiment, of the three beams (not shown), the main beam returns to the light-emitting point, whereas one auxiliary beam travels above the semiconductor laser chip 5 and the other auxiliary beam is scattered by the conductive die-bonding paste 20 and is not regularly reflected on the discharge surface of the semiconductor laser chip 5. That is, the auxiliary beams do not return to an optical detector (not shown). Thus, no noise is generated.

The conductive die-bonding paste used in the embodiment contains an epoxy resin as a base material and silver flakes as conductive filler, the content of the latter being 80 wt % or more. The resin to be used as a base material of the conductive die-bonding paste is not limited to the epoxy resin, but silicone resin or polyimide resin may be used. However, because the polyimide resin has a high thermosetting temperature, it takes much time to harden it. Thus, the polyimide resin may give a bad influence on other materials. On the other hand, because the silicone resin is still soft after it was set or hardened, there is a possibility that the die-bonding position of the semiconductor laser chip and its orientation may be shifted by an external shock which may be given to the hardened silicone resin. With the shift of the die-bonding position of the semiconductor laser chip and its orientation, the optical axis of the semiconductor laser chip is displaced with respect to that of an optical system of an optical disk system for which the semiconductor laser apparatus is used. Thereby, information of the optical disk cannot be read.

On the other hand, when the conductive die-bonding paste contains the epoxy resin as a base material as in the embodiment, there is little difference in the shape of the conductive die-bonding paste between before and after it sets or hardens. Thus, in hardening the conductive die-bonding paste, the position and orientation of the semiconductor laser chip are prevented from being changed. Consequently, when the semiconductor laser apparatus of the embodiment is used for an optical pick-up, it is easy to correctly set the positional relationship between the semiconductor laser apparatus and other optical elements of the optical pick-up.

The semiconductor laser apparatus of the embodiment and the method of producing it has been described on the case in which the semiconductor laser chip is directly mounted on the stem. But apparently, the present invention is also applicable to a case in which the semiconductor laser chip is mounted on a sub-mount made of ceramic, silicon or the like, and the sub-mount with the chip is then mounted on a stem, and also to a case in which the semiconductor laser chip is mounted on a lead frame.

Although the dispensing method has been described as the conductive die-bonding paste application method, a stamping method may be used.

Also, as a material of the conductive filler, metals such as gold, copper, or palladium may be used instead of silver.

As described above, when the semiconductor laser apparatus of the present invention is used for the optical pick-up using the three-beam scheme, the conductive die-bonding paste does not cause regular reflection of the auxiliary beams. Thus, no noise is generated.

Further, because the semiconductor laser apparatus is assembled with the conductive die-bonding paste, it is possible to shorten a heating/cooling time period. Further, because the heating temperature is low, other component parts of the semiconductor laser apparatus are not affected thereby. Furthermore, the conductive die-bonding paste does not obstruct the main-discharge-side light-emitting point or the monitoring-side light-emitting point, because after the dispensed conductive die-bonding paste is dispensed to the predetermined position, it is preheated to reduce its viscosity. This in particular allows use of a conductive die-bonding paste that contains much conductive filler and thus has a low electric resistance. Therefore, the method of the present invention is preferably used to bond a semiconductor laser chip to which a large current is applied.

Further, in the semiconductor laser apparatus production method of the present invention, owing to the use of the conductive die-bonding paste containing the epoxy resin as a base material, the die-bonding position of the semiconductor laser chip and its orientation do not shift when the conductive die-bonding paste is hardened. Therefore, after the conductive die-bonding paste is hardened, the mounted position of the semiconductor laser chip and its orientation hardly shift. Accordingly, it is easy to correctly set the positional relationship between the semiconductor laser apparatus and other optical elements when the semiconductor laser apparatus is used for the optical pick-up.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a semiconductor laser apparatus, comprising the steps of:

applying a conductive die-bonding paste to a bonding surface in a predetermined position thereof;

preheating the applied conductive die-bonding paste and then placing a semiconductor laser chip on the preheated conductive die-bonding paste; and heating the preheated conductive die-bonding paste to a temperature higher than a temperature at which the conductive die-bonding paste starts a thermosetting reaction to thereby harden the conductive die-bonding paste.

2. A method according to claim 1, wherein a temperature at which the conductive die-bonding paste is preheated is equal to or higher than a temperature at which a diluent of the conductive die-bonding paste starts to transpire, but lower than a temperature at which the conductive die-bonding paste starts a thermosetting reaction.

3. A method according to claim 1, wherein said conductive die-bonding paste contains an epoxy resin as a base material and is preheated at a temperature of 60° C. or more but lower than 100° C.

4. A method according to claim 3, wherein said conductive die-bonding paste is preheated at a temperature of 60° C. to 80° C. inclusive.

5. A method according to claim 1, wherein the preheating is performed until the conductive die-bonding paste becomes as thin as about 0.02 mm.

6. A method according to claim 1, wherein the preheating is performed for two seconds or more.

7. A semiconductor laser apparatus produced by the method of claim 1.

8. The method of claim 1, wherein the conductive dye-bonding paste adheres to a lower part of each end surface of the chip, and a highest position of the conductive dye-bonding paste on the lower part of each end surface of the chip is at a height of more than 0.01 mm from the bonding surface and hence from the bottom of the chip, but is below the light-emitting point of the chip.

9. The method of claim 1, wherein the conductive dye-bonding paste comprises epoxy resin and at least 80% by weight conductive filler of metal particles and/or flakes.

* * * * *